(12) United States Patent
Scholz et al.

(10) Patent No.: US 6,673,686 B1
(45) Date of Patent: Jan. 6, 2004

(54) METHOD OF FORMING A GATE ELECTRODE CONTACT SPACER FOR A VERTICAL DRAM DEVICE

(75) Inventors: Arnd R. Scholz, Dresden (DE); Klaus M. Hummler, Poughkeepsie, NY (US)

(73) Assignee: Infineon Technologies AG, Munich (DK)

( * ) Notice: Subject to any disclaimer, the term of this patent is extended or adjusted under 35 U.S.C. 154(b) by 0 days.

(21) Appl. No.: 10/215,747

(22) Filed: Aug. 9, 2002

(51) Int. Cl.[7] .............................................. H01L 21/336
(52) U.S. Cl. ...................... 438/302; 438/303; 438/304; 438/305
(58) Field of Search ................................. 438/302–305

(56) References Cited

U.S. PATENT DOCUMENTS 6,391,731 B1 * 5/2002 Chong et al. ............... 438/303

* cited by examiner

*Primary Examiner*—D Le
(74) *Attorney, Agent, or Firm*—Slater & Matsil, LLP

(57) ABSTRACT

A gate electrode contact spacer (144) for a vertical DRAM device (100) and a method for forming the same. Memory cells (118) are formed within deep trenches (116) of a workpiece (112). A temporary spacer adjacent gate electrode contacts (132) and pad nitride layer are removed. A spacer material is deposited over exposed portions of the workpiece (112) and over the top and sides of the gate electrode contacts (132). The spacer material is removed from the horizontal surfaces of the DRAM device (100), including the exposed portions of the workpiece (112) and the top of the gate electrode contacts (132). Spacers (144) having sidewalls sloping downwardly away from the gate electrode contacts (132) are left remaining on the gate electrode contact (132) sides, preventing voids from forming during a subsequent array top oxide deposition. Spacers may also be formed adjacent top regions of isolation trenches simultaneously with the formation of spacers (144).

16 Claims, 5 Drawing Sheets

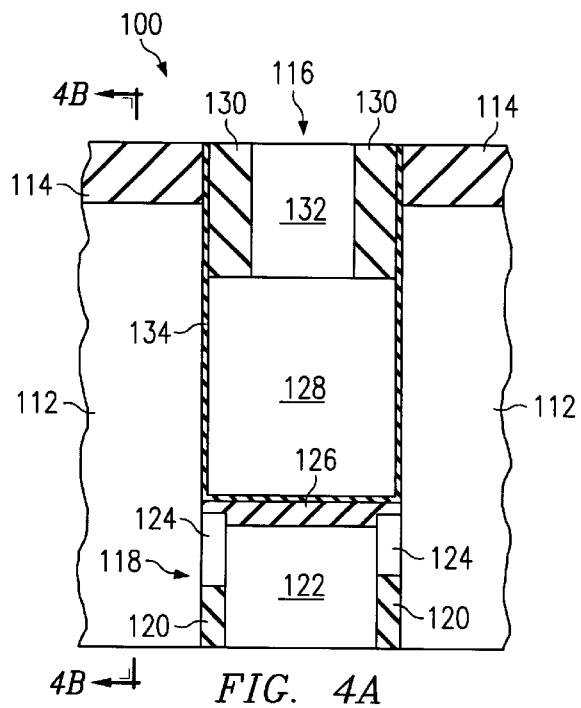
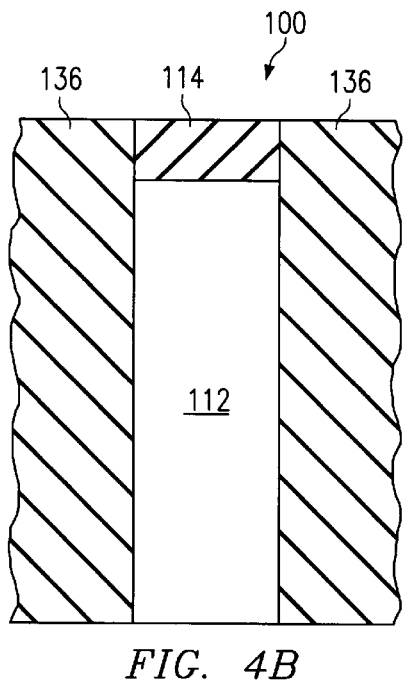
FIG. 4A          FIG. 4B
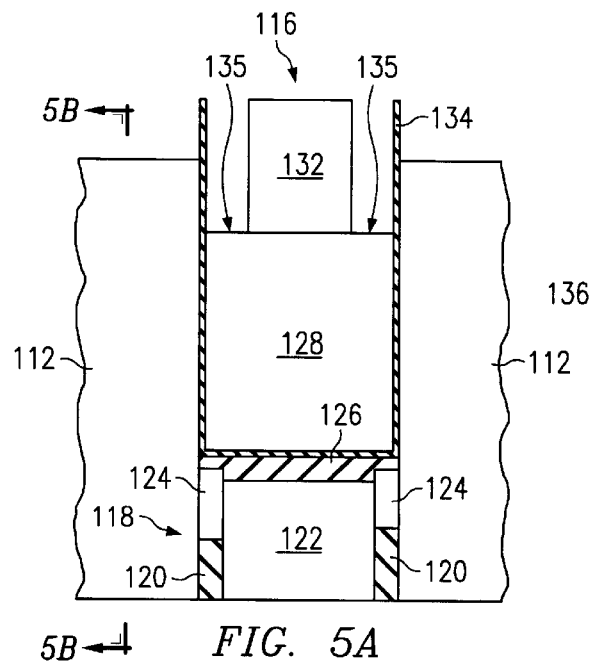
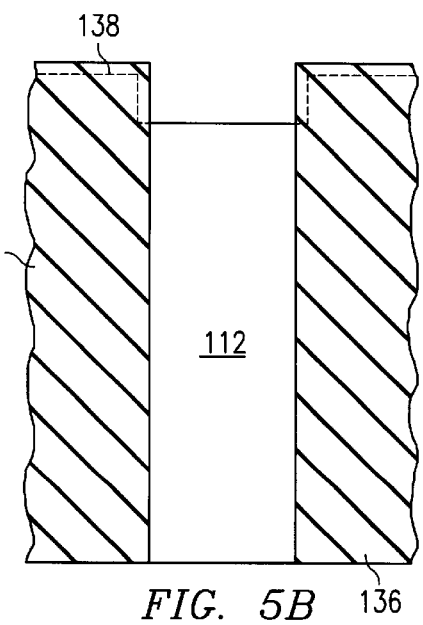
FIG. 5A          FIG. 5B

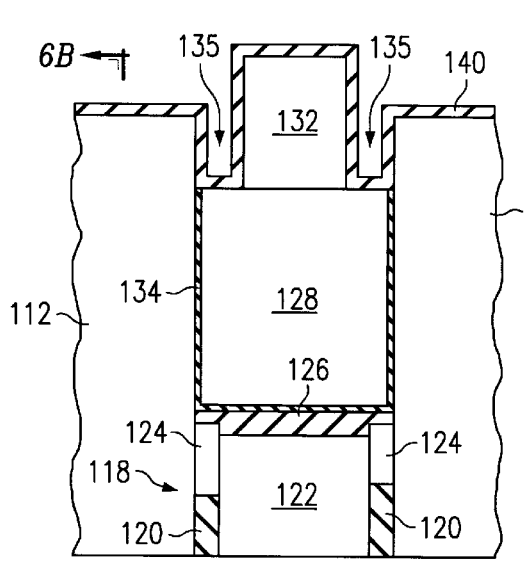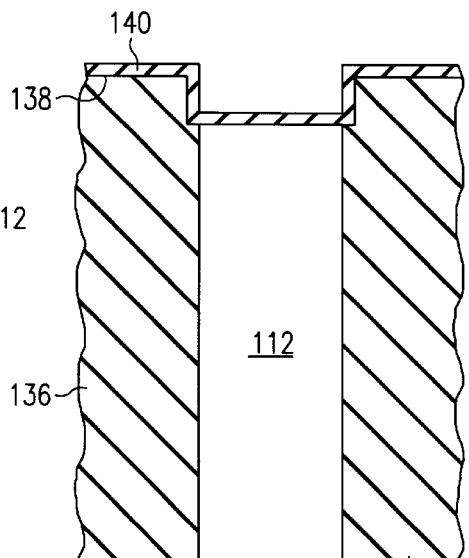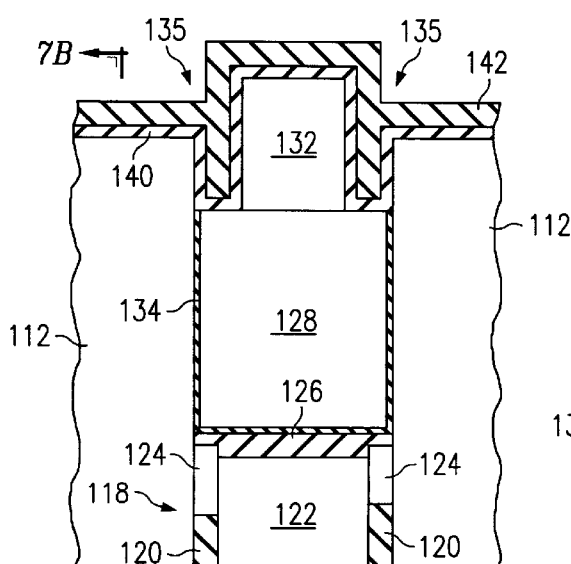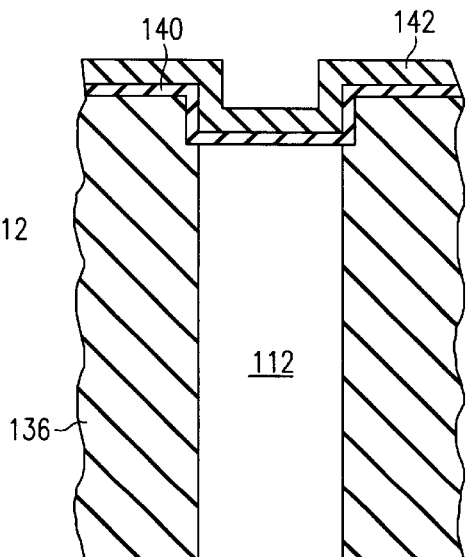

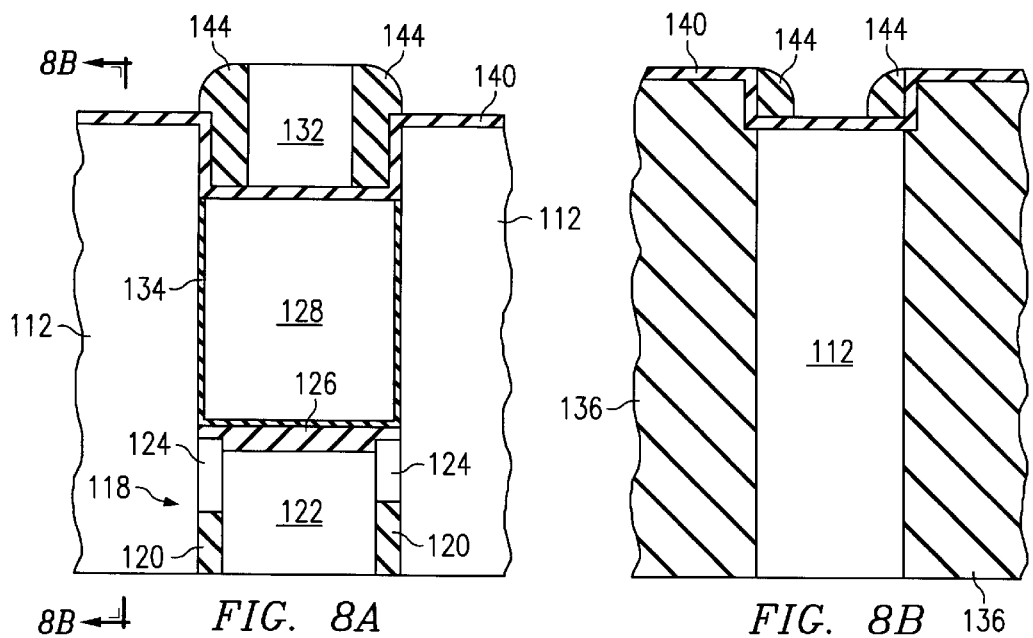

US 6,673,686 B1

METHOD OF FORMING A GATE ELECTRODE CONTACT SPACER FOR A VERTICAL DRAM DEVICE

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and a common type of semiconductor memory is a dynamic random access memory (DRAM).

A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

One type of DRAM storage capacitor is formed by etching deep trenches in a semiconductor substrate, and depositing a plurality of layers of conductive and insulating materials thereon in order to produce a storage capacitor that is adapted to store data, represented by a one or zero. Planar DRAM designs typically comprise an access FET disposed in a subsequently deposited layer, disposed above and to the side of the storage capacitor.

The semiconductor industry in general is being driven to decrease the size of semiconductor devices located on integrated circuits. Miniaturization is generally needed to accommodate the increasing density of circuits necessary for today's semiconductor products. More recent DRAM designs involve disposing the access FET directly above the storage capacitor, sometimes referred to as a vertical DRAM, which saves space and results in the ability to place more DRAM cells on a single chip.

A prior art vertical DRAM device 10 is shown in FIG. 1, after the formation of the memory cells 18 within deep trenches 16. To form the memory cells 18, a plurality of trenches 16 are formed in a semiconductor substrate 12 or workpiece having a pad nitride 14, comprising silicon nitride, for example, disposed thereon. A storage capacitor 18 is formed within the bottom portion of the deep trenches 16. The storage capacitor 18 includes a collar oxide 20, buried strap 24 and capacitor inner plate 22, for example. A buried plate may be disposed in the lower part of the trench (not shown). A trench top oxide (TTO) 26 is formed over the top surface of the storage capacitor 18, and a gate electrode 28 is formed over the TTO 26. A gate electrode contact 32 is disposed over the gate electrode 28. The gate electrode contact 32 will be coupled in a subsequent processing step to an overlying conductive layer such as a wordline or bitline (not shown), in order to access the memory cell 18, referred to as a CB etch, or contact to bitline etch.

To prevent shorts of the memory cell to the wordlines and bitlines, or from wordline to bitlines, typically the gate electrode contact 32 has a smaller width or diameter than the width or diameter of the gate electrode 28. More particularly, the top of the deep trench 16 has a larger width than the gate electrode contact 32 width. At the point in the manufacturing process shown in FIG. 1, a temporary spacer 30 has been formed above the gate electrode 28, between the gate contact 32 and the adjacent substrate 12 and pad nitride 14. The temporary spacer 30 functions to reserve the space where a divot fill 62 will later be formed (see FIG. 3). A thin oxide layer 34 has been formed on the edge of the pad nitride 14 adjacent the temporary spacer 30, resulting from oxidation that has occurred during the various processing steps of the memory cell 18, such as the formation of a gate oxide, for example.

The next step in the manufacturing process of the vertical DRAM device 10 typically comprises removing the pad nitride 14, as shown in the prior art drawing of FIG. 2. Because the temporary spacer 30 comprises silicon nitride, the same material as the pad nitride 14, the temporary spacer 30 is removed during the removal of the pad nitride 14. The nitride material 14/30 removal step results in a residual amount of oxide 34 remaining over the substrate 12 at the edge of the deep trenches 16. A recess 35 or divot is created over the gate electrode 28 when the temporary spacer 30 is removed. The next step in the manufacturing process is to replace the temporary spacer 30 with a divot fill 62, as shown in FIG. 3. The divot fill 62 protects the gate electrode 28 during a subsequent gate electrode (GC) etch. The divot fill 62 also protects the gate electrode 28 during a subsequent CB etch.

SUMMARY OF THE INVENTION

Embodiments of the present invention achieve technical advantages as a gate electrode contact permanent spacer and method of forming thereof. The spacer is formed by removing temporary spacer material, depositing a first material over the top and sides of the gate electrode contact and exposed portions of the workpiece, and then removing the first material from the top surfaces, leaving the first material on the gate electrode sides. The spacer has sloped sidewalls which is advantageous because the sloped sidewalls prevent voids from forming in a subsequent array top oxide deposition step. Spacers may be formed in both the array region, adjacent the gate electrode sides, and also in the support region, at the edges of the isolation trenches.

In one embodiment, a method of forming replacement spacers of a semiconductor device having topographical features and temporary spacers adjacent the topographical features is disclosed, wherein the topographical features include top surfaces and vertical surfaces. The method includes removing the temporary spacers, depositing a permanent spacer material over the semiconductor device topographical features, and removing the permanent spacer material from the topographical feature top surfaces, leaving permanent spacers adjacent vertical surfaces of the topographical features.

In another embodiment, a method of forming a memory device includes providing a workpiece, forming a pad nitride over the workpiece, and forming a plurality of trenches within the workpiece and pad nitride. A capacitor is formed within each trench, and a trench top oxide is formed over the trench capacitors. A gate electrode is formed over the trench top oxide, and a gate electrode contact is formed over the gate electrode. The gate electrode contact has a smaller width than the gate electrode, and the gate electrode contact is separated from the workpiece by a temporary nitride spacer disposed over the gate electrode. The temporary nitride spacer and pad nitride are removed from the workpiece, leaving the top of the workpiece exposed and a divot adjacent the gate electrode contact. A spacer material is deposited over exposed portions of the workpiece and gate electrode and over the top and sides of the gate electrode contact, at least filling the divot, and the spacer material is removed from the top surface of the workpiece and the top of the gate electrode contacts, leaving a portion of the spacer material comprising a spacer on the sides of the gate electrode contact.

Also disclosed is a method of manufacturing a vertical DRAM device, comprising providing a workpiece, forming a pad nitride over the workpiece, forming deep trenches within the workpiece and pad nitride, and forming a memory cell within each deep trench. The memory cell includes a gate electrode disposed near the top of each deep trench and a gate electrode contact adjacent each gate electrode. The gate electrode contact has a smaller width than the gate electrode, and the gate electrode contact is separated from the workpiece by a temporary nitride spacer disposed over the gate electrode. The method includes removing the pad nitride and temporary nitride spacer, depositing a nitride layer over exposed portions of the workpiece and gate electrode and over the top and sides of the gate electrode contact, and removing the nitride layer from the top surface of the workpiece and the top of the gate electrode contacts, leaving a portion of the nitride layer comprising a spacer on at least the sides of the gate electrode contact, wherein the spacer includes side surfaces sloping downwardly away from the gate electrode contact top surface.

In another embodiment, a memory device includes a workpiece, a plurality of trenches formed within the workpiece, a storage capacitor formed within each trench, and trench top oxide disposed over the storage capacitor. A gate electrode is disposed over the trench top oxide, and a gate electrode contact is disposed over the gate electrode. The gate electrode contact has a smaller width than the gate electrode, and the gate electrode contact includes sidewalls and a top surface. A spacer is formed between the workpiece and the gate electrode contact over the gate electrode, the spacer being adjacent the sidewall of the gate electrode contact. The spacer comprises side surfaces sloping downwardly away from the gate electrode contact top surface.

Advantages of embodiments of the invention include providing a gate electrode contact spacer and a method of forming thereof that prevents void formation during subsequent ATO deposition. Spacers may be simultaneously formed adjacent gate electrode contacts and along the upper edge of isolation trenches between memory cell active regions, in accordance with embodiments of the invention.

BRIEF DESCRIPTION OF THE DRAWINGS

The above features of embodiments of the present invention will be more clearly understood from consideration of the following descriptions in connection with accompanying drawings in which:

FIGS. 4–9 illustrate cross-sectional views of a manufacturing process for forming permanent spacers adjacent gate electrode contacts of a vertical DRAM cell in accordance with an embodiment of the present invention.

FIGS. 4 through 8 include both an A and B figure. The B figures depict a view perpendicular to the device from the view shown in the respective A figures in the active area. The B figures show isolation trenches that reside between adjacent vertical DRAM cells.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Problems with permanent gate electrode contact spacers will be discussed, followed by a description of preferred embodiments of the present invention and some advantages thereof. A cross-section of one memory cell is shown in each figure, although many other memory cells and components of memory cells may be present in the semiconductor devices shown.

Figure 1:
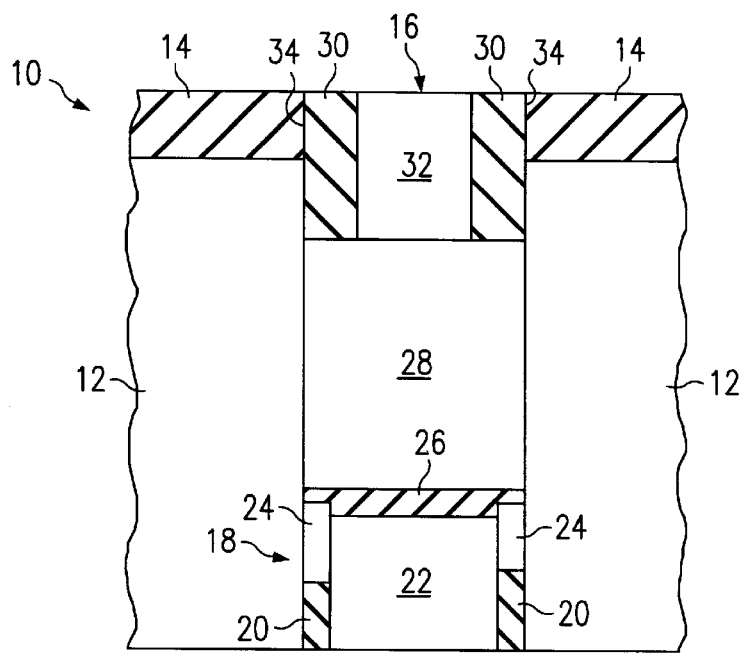
FIGS. 1–3 show cross-sectional views of a prior art vertical DRAM device at various stages of manufacturing.
Figure 2:
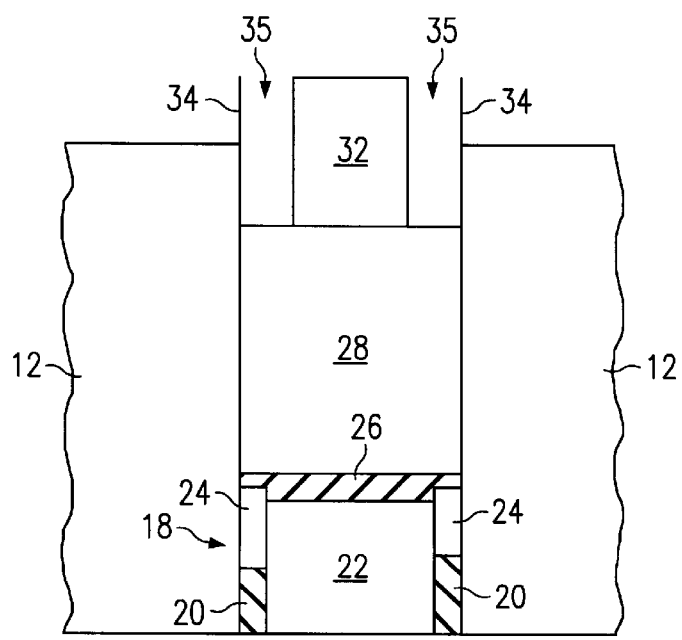
Figure 3:
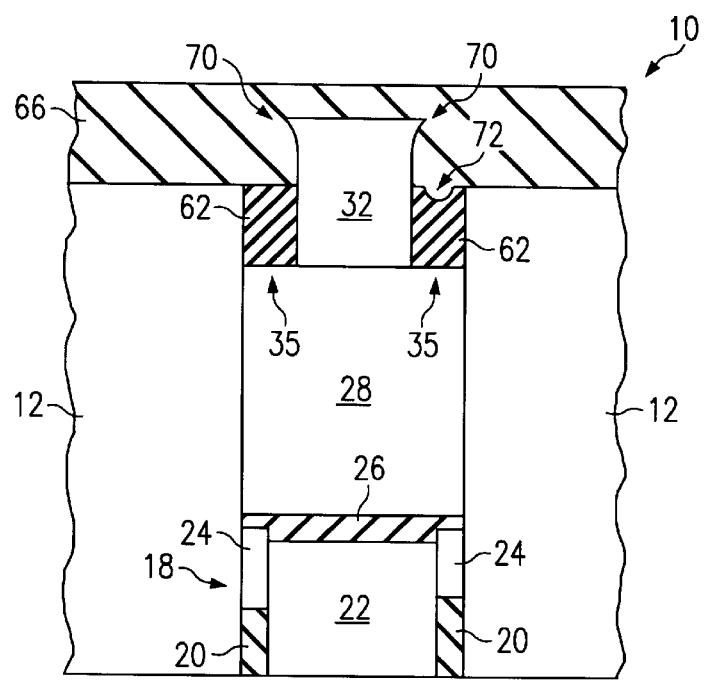

FIG. 3 illustrates a cross-sectional view of some problems that may arise when forming a divot fill 62 proximate a vertical DRAM 10 gate electrode contact 32. First, the thin layer of oxide 34 residing at the edge of the substrate 12 after the pad nitride 14 and temporary spacer 30 removal (see FIG. 2) comprises a filament that can cause problems when the recess 35 or divot is filled with a "divot fill" material. The filament 34 is very thin, e.g., about 6 nm thick, and thus, the filament 34 tends to fall over during the divot 35 fill process, either towards the divot 35 or towards the workpiece 12, for example. If the filament 34 falls towards the divot 35, the oxide filament 34 may prevent the divot 35 from being completely filled, resulting in voids in the divot fill, (not shown). Alternatively, if the filament 34 falls towards the workpiece 12, the divot 35 may be filled completely. Thus, if not removed, the filament 34 creates uncertainty in the manufacturing process.

Another problem may be caused by seam voids in the divot fill 62 material. The divot fill 62 material is typically formed by depositing a nitride material layer over exposed portions of the substrate 12, the top and sides of the gate electrode contact 32, and exposed portions of the gate electrode 28 residing within the divot 35. The nitride material layer deposited is typically conformal and results in a fill seam approximately at the midpoint of the divot 35. The nitride material layer is then etched back using a wet etch process. The wet etch process amplifies the fill seam, removing an excessive amount of nitride material over the fill seam and creating a recess 72, which is undesirable because it leads to array top oxide (ATO) 66 fill voids and the loss of GC etch or CB etch protection for the gate electrode contact 28.

Another problem that can occur is the formation of voids adjacent the gate electrode contact 32 during the deposition of the ATO 66, after the formation of the divot fill 62 material. The gate electrode contact 32 often is not completely vertical, but rather, includes an overhang 70 at the top surface. Because the ATO typically comprises a high density plasma (HDP) oxide, which is deposited using an isotropic deposition, there is a high possibility of void formation under the overhangs 70 proximate the gate electrode 28 and gate electrode contact 32 interface. While voids in general in an isolation layer is undesirable, voids in the ATO are particularly undesirable because the ATO may be subjected to a wet etch in subsequent processing.

Embodiments of the present invention achieve technical advantages by providing a method of forming permanent spacers that prevents void formation during the formation of the permanent spacers, and also prevents void formation during the subsequent ATO deposition.

FIGS. 4–9 show cross-sectional views of a semiconductor wafer 100 comprising a vertical DRAM device in various stages of manufacturing in accordance with an embodiment of the present invention. Shown in FIG. 4A, a semiconductor wafer workpiece 112 comprising a substrate is provided. The workpiece 112 typically comprises a semiconductor wafer comprising single-crystal silicon, and may include other conductive layers or other semiconductor elements such as transistors or diodes, as examples. The workpiece 112 may alternatively comprise semiconductors such as GaAs, InP, Si/Ge, SiC, or compound semiconductors, as examples. A pad nitride 114 is deposited over the semiconductor substrate 112. The pad nitride 114 preferably comprises silicon nitride deposited in a thickness of 100–300 nm, as an example. Alternatively, pad nitride 114 may comprise other nitrides or oxides, as examples.

A plurality of trenches 116 is formed in the workpiece 112. The trenches 114 may have a high aspect ratio, e.g., the depth may be much greater than the width. For example, the trenches 114 may be 200 nm wide and 8 μm deep below the top surface of the workpiece 112. The trenches 114 may have an oval shape when viewed from the top surface of the wafer, and alternatively, the trenches 114 may comprise other shapes, such as square, rectangular, or circular, as examples. The trenches 114 may form a storage node or capacitor of a memory cell, such as in a DRAM, for example.

A buried plate is formed, and a node dielectric is formed (not shown). The trenches 116 are lined with a collar oxide 120, and the trenches 116 are filled with a semiconductor material such as polysilicon, to form the capacitor inner plate 122 and buried strap 124. The semiconductor material is etched back below the workpiece 112 top surface, and a trench top oxide (TTO) 126 is formed over the capacitor inner plate 122 and buried strap 126.

A gate oxide 134 may be formed over the trench sidewalls, and a semiconductor material may be deposited to form a gate electrode 128. A gate electrode contact 132 comprising polysilicon, for example, is formed over gate electrode 128. The gate electrode contact 132 material is deposited, and then etched back to a level below the substrate 112 top surface.

A temporary spacer material 130 comprising a nitride such as silicon nitride, as an example, is deposited, for example, using a conformal deposition. The temporary spacer material is etched back, e.g., using an anisotropic etch-back process, to remove the temporary spacer material 130 from the central region of the trench 116, and leave temporary spacer material 130 on the sidewalls. A top portion of the pad nitride 114 and temporary spacer material 130 is removed by planarization, for example.

A semiconductor material such as polysilicon is deposited over the wafer to fill the central region of the trench 116 and form gate electrode contact 132 adjacent the temporary spacer material 130, over the gate electrode 128. The wafer is planarized again to remove excess gate electrode contact 132 material. The temporary spacer material 130 allows the formation of a gate electrode contact 132 having a smaller diameter than the underlying gate electrode 128. The temporary spacer material 130 also reserves the space between the gate electrode contact 132 and the substrate 112, until the time that a permanent spacer is formed in accordance with an embodiment of the present invention, to be described further herein.

FIG. 4B shows a view of the active area perpendicular to the memory device 100 from the view shown in FIG. 4A, showing isolation trenches 136 that reside between adjacent vertical DRAM devices 100.

The pad nitride 114 and temporary spacer 130 are removed, as shown in FIGS. 5A and 5B, using a nitride etch process. The pad nitride 114 and temporary spacer 130 are preferably stripped in a single etch step, using hot phosphoric acid, as an example, although other nitride etch processes may be utilized. A portion of the temporary spacer 130 may remain within the bottom of the divot 135, for example, after the nitride etch (not shown). An oxide filament 134 may remain over the edge of the workpiece 112 after the nitride strip, as shown in FIG. 5A.

Next, the oxide filament 134 is removed, preferably using an oxide strip process, such as a 40:1 BHF etch, removing 6 nm or less of oxide, as shown in FIG. 6A. Advantageously, in accordance with embodiments of the invention, the oxide filament 134 strip also simultaneously removes a top portion of the isolation trenches 136, as shown at 138 in FIGS. 5B and 6B. The filament etch process also laterally pulls back the edge of the isolation trenches 136, which advantageously allows more of the permanent spacer (see FIG. 8B) to be disposed in subsequent processing steps over the isolation trenches 136, leaving more active silicon 112 area available to be contacted in subsequent processing steps by the CB etch.

Next, a thin oxide layer 140 is deposited over the workpiece 112, exposed portions of the gate electrode 128, the top and sides of the gate electrode contact 132, and the isolation trenches 136, as shown in FIGS. 6A and 6B. The oxide layer 140 is preferably formed by thermal oxidation, and alternatively may be formed by other oxide deposition methods, as examples.

In accordance with an embodiment of the present invention, a permanent spacer material 142 is deposited over the oxide layer 140, as shown in FIGS. 7A and 7B. The spacer material 142 preferably comprises a nitride material such as silicon nitride, for example. Alternatively, the spacer material 142 may comprise other nitride materials, as examples. The spacer material 142 is preferably conformal, and fills the divot 135, as shown. Also, the spacer material 142 is preferably deposited with a significant overfill, e.g., an excess of 30 to 50% more than ½ the width of the divot 135 of material.

The workpiece 112 is exposed to an etch process to remove the spacer material 142 from the top surface of the workpiece 112 and the top surface of gate electrode contact 132. Preferably, the etch process comprises a dry anisotropic etch, leaving spacer material 142 in the sidewalls of topographical features such as gate electrode contacts 132. The spacer material 142 is preferably etched using an anisotropic nitride etch chemistry, for example. The anisotropic etch preferably leaves spacers 144 adjacent gate electrode contact material having side surfaces sloping downwardly away from the gate electrode contact 144 top surface, as shown in FIGS. 8A and 8B.

Advantageously, in an embodiment of the invention, spacers 144 also having side surfaces sloping downwardly away from the isolation trench top surfaces are also formed adjacent a top region of isolation trenches 136, simultaneously with the formation of the gate electrode contact spacers 144, as shown in FIG. 8B. Because the isolation trench 136 top and sidewalls have been etched back (e.g. to 138, see FIG. 5B), the spacers 144 shown in FIG. 8B partially cover the isolation trench 146, freeing up more of the active area of the substrate 112, which is advantageous in subsequent etch steps.

Figure 9:
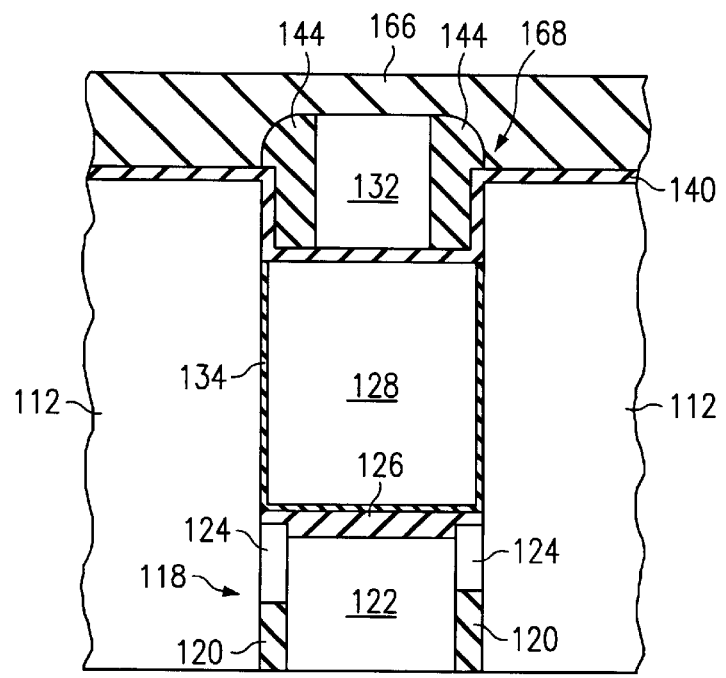

Because the anisotropic etch shapes the spacers 144 with curved sidewalls, the formation of voids during array top oxide (ATO) is prevented, e.g. at 168, as shown in FIG. 9. ATO deposition comprising HDP oxide has a tendency to form voids, which is avoided by the curved spacers 144 of the present invention. Advantageously, the formation of voids proximate the isolation trenches is also prevented, due to the permanent spacers 144 having curved sidewalls, as shown in FIG. 8B.

Embodiments of the present invention are directed towards the fabrication of semiconductor devices, memory devices and vertical DRAM's. An embodiment of the present invention further includes a memory device, comprising a workpiece, a plurality of trenches formed within the workpiece, a storage capacitor formed within each trench, and trench top oxide disposed over the storage capacitor. The memory device includes a gate electrode disposed over the trench top oxide, and a gate electrode contact disposed over the gate electrode, the gate electrode contact having a smaller width than the gate electrode, and the gate electrode contact including sidewalls and a top surface. A spacer is formed between the workpiece and the gate electrode contact over the gate electrode, the spacer being adjacent the sidewall of the gate electrode contact, wherein the spacer comprises side surfaces sloping downwardly away from the gate electrode contact top surface.

While embodiments of the present invention are primarily described herein with reference to DRAM devices, they also have useful application in ferroelectric random access memory (FRAM) devices and other semiconductor devices, as examples. Embodiments of the present invention are useful in semiconductor manufacturing in any application where a temporary spacer is replaced with a divot fill material, particularly in low aspect ratio applications where a divot fill process is ineffective.

Embodiments of the present invention provide several advantages, including preventing void formation during ATO deposition, adjacent both the gate electrode contacts 132 and isolation trenches 144. Another advantage includes a decreased number of shorts caused by contact to subsequently deposited wordlines or bitlines, due to the increased amount of spacer material 144 disposed above the surface of the workpiece 112. Void formations in the spacer itself are prevented, because sacrificial temporary spacers are removed prior to formation of the permanent spacers 144. The invention benefits from processing combination: the filament 134 removal, which can cause voids, is combined with the pullback of the isolation trench 136. The filament removal 134 and isolation trench 136 pullback are accomplished in a single etching step. Also, advantageously, a spacer 144 is formed on the isolation trench 136 (FIG. 8B) simultaneously with the formation of the permanent replacement spacer adjacent the gate electrode contact 132 and gate electrode 128. A bathtub-shaped topography over isolation trenches 126 is formed by the spacers 144, which is advantageous for ATO 166 (FIG. 9) deposition.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of providing replacement spacers, said replacement spacers proximate a semiconductor device formed in a trench defined in a semiconductor substrate, said semiconductor device having topographical features and temporary spacers adjacent the topographical features, the topographical features including top surfaces and vertical surfaces that extend above the top surface of said semiconductor substrate, and said temporary spacers filling said trench between said vertical surface and the sidewalls of said trench, the method comprising the steps of:

removing the temporary spacers that fill said trench;

re-filling said trench and covering said topographical features by depositing a permanent spacer material over the semiconductor device;

selectively removing the permanent spacer material from the topographical feature top surfaces, extending above said semiconductor substrate; and leaving permanent spacers between said vertical surfaces and said sidewalls of said trench and adjacent vertical surfaces of the topographical features extending above said semiconductor substrate.

2. The method according to claim 1, wherein said step of selectively removing the permanent spacer material from the topographical feature top surfaces that extend above said semiconductor substrate further comprises leaving permanent spacers having side surfaces sloping downwardly away from the topographical feature top surfaces.

3. The method according to claim 2 further including a pad nitride layer deposited over the top surface of said semiconductor substrate and wherein said step of removing the temporary spacers further comprises the step of removing said pad nitride layer.

4. The method according to claim 1, wherein removing the permanent spacer material comprises a dry etch.

5. The method according to claim 1, wherein removing the permanent spacer material comprises an anisotropic etch.

6. The method according to claim 1, wherein depositing a permanent spacer material comprises depositing a conformal material.

7. The method according to claim 1, wherein depositing a permanent spacer material comprises depositing a nitride.

8. The method according to claim 1 wherein said temporary spacers include a nitride material.

9. The method according to claim 1 further including a pad nitride layer deposited over the top surface of said semiconductor substrate and wherein said step of removing the temporary spacers includes removing said pad nitride layer.

10. The method according to claim 9 wherein said temporary spacer is a nitride spacer separated from the pad nitride by a thin oxide layer, further comprising the step of removing the thin oxide layer after removing the temporary nitride spacer and pad nitride.

11. The method according to claim 10 wherein said semiconductor device comprises a plurality of semiconductor devices and further comprising the step of separating said plurality of semiconductor devices with a plurality of isolation trenches.

12. The method according to claim 11 removing the thin oxide layer further comprises the step of removing a top and side portion of the isolation trenches.

13. The method according to claim 12 wherein depositing a spacer material and removing the spacer material further comprises the step of forming spacers adjacent a top region of the isolation trenches.

14. The method according to claim 1 wherein said semiconductor device comprises a plurality of semiconductor devices and further comprising the step of separating said plurality of semiconductor devices with a plurality of isolation trenches.

15. The method according to claim 1 further comprising the step of forming an array top oxide (ATO) over said top surfaces of said topographical features and the spacer.

16. The method according to claim 15 wherein forming an ATO comprises the step of depositing a high density plasma (HDP) oxide, wherein no voids are formed between the spacers and the HDP oxide.

* * * * *

UNITED STATES PATENT AND TRADEMARK OFFICE
CERTIFICATE OF CORRECTION

PATENT NO. : 6,673,686 B1
DATED : January 6, 2004
INVENTOR(S) : Scholz et al.

It is certified that error appears in the above-identified patent and that said Letters Patent is hereby corrected as shown below:

<u>Title page,</u>
Item [73], Assignee, delete "(DK)" and replace with -- (DE) --.

<u>Column 9,</u>
Line 6, delete "claim 11 removing" and replace with -- claim 11 wherein removing --.

Signed and Sealed this

Sixth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,673,686 B1 Page 1 of 1
DATED : January 6, 2004
INVENTOR(S) : Scholz et al.

It is certified that error appears in the above-identified patent and that said Letters Patent is hereby corrected as shown below:

Column 8,
Line 26, delete "surfaces, extending" and replace with -- surfaces extending.--

Signed and Sealed this

Fifteenth Day of June, 2004

JON W. DUDAS
*Acting Director of the United States Patent and Trademark Office*